United States Patent
Chen et al.

(10) Patent No.: US 12,237,417 B2
(45) Date of Patent: *Feb. 25, 2025

(54) FinFET DEVICE AND METHOD OF FORMING AND MONITORING QUALITY OF THE SAME

(71) Applicant: Taiwan Semiconductor Manufacturing Co., Ltd., Hsinchu (TW)

(72) Inventors: Chang-Yin Chen, Taipei (TW); Che-Cheng Chang, New Taipei (TW); Chih-Han Lin, Hsinchu (TW); Horng-Huei Tseng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 11 days.

This patent is subject to a terminal disclaimer.

(21) Appl. No.: 18/061,862

(22) Filed: Dec. 5, 2022

(65) Prior Publication Data

US 2023/0114917 A1     Apr. 13, 2023

Related U.S. Application Data

(60) Continuation of application No. 17/074,532, filed on Oct. 19, 2020, now Pat. No. 11,522,084, which is a
(Continued)

(51) Int. Cl.
*H01L 21/82*     (2006.01)
*H01L 21/3213*    (2006.01)
(Continued)

(52) U.S. Cl.
CPC ...... *H01L 29/785* (2013.01); *H01L 21/32136* (2013.01); *H01L 21/32137* (2013.01);
(Continued)

(58) Field of Classification Search
None
See application file for complete search history.

(56) References Cited

U.S. PATENT DOCUMENTS 9,620,417 B2   4/2017 Chen et al.
9,793,269 B2   10/2017 Chang et al.
(Continued)

FOREIGN PATENT DOCUMENTS

DE     102015105856 A1    3/2016
DE     102016100035 A1    1/2017
(Continued)

*Primary Examiner* — Benjamin P Sandvik
(74) *Attorney, Agent, or Firm* — Slater Matsil, LLP

(57) ABSTRACT

A FinFET structure with a gate structure having two notch features therein and a method of forming the same is disclosed. The FinFET notch features ensure that sufficient spacing is provided between the gate structure and source/drain regions of the FinFET to avoid inadvertent shorting of the gate structure to the source/drain regions. Gate structures of different sizes (e.g., different gate widths) and of different pattern densities can be provided on a same substrate and avoid inadvertent of shorting the gate to the source/drain regions through application of the notched features.

20 Claims, 15 Drawing Sheets

Related U.S. Application Data continuation of application No. 16/051,293, filed on Jul. 31, 2018, now Pat. No. 10,811,536, which is a division of application No. 15/002,287, filed on Jan. 20, 2016, now Pat. No. 10,096,712.

(60) Provisional application No. 62/261,746, filed on Dec. 1, 2015, provisional application No. 62/244,087, filed on Oct. 20, 2015.

(51) Int. Cl.
  *H01L 21/66* (2006.01)
  *H01L 21/67* (2006.01)
  *H01L 21/8234* (2006.01)
  *H01L 29/423* (2006.01)
  *H01L 29/49* (2006.01)
  *H01L 29/51* (2006.01)
  *H01L 29/66* (2006.01)
  *H01L 29/78* (2006.01)
  *G01N 21/88* (2006.01)

(52) U.S. Cl.
  CPC .. *H01L 21/32139* (2013.01); *H01L 21/67288* (2013.01); *H01L 21/823431* (2013.01); *H01L 21/823437* (2013.01); *H01L 22/12* (2013.01); *H01L 29/42372* (2013.01); *H01L 29/4916* (2013.01); *H01L 29/517* (2013.01); *H01L 29/518* (2013.01); *H01L 29/66795* (2013.01); *G01N 2021/8848* (2013.01)

(56) References Cited

U.S. PATENT DOCUMENTS

| | | | |
|---|---|---|---|
| 10,096,712 | B2 | 10/2018 | Chen et al. |
| 11,522,084 | B2* | 12/2022 | Chen ............... H01L 29/517 |
| 2003/0197872 | A1 | 10/2003 | Littau et al. |
| 2004/0262692 | A1 | 12/2004 | Hareland et al. |
| 2005/0148137 | A1* | 7/2005 | Brask ........... H01L 21/823828 |
| | | | 257/E29.151 |
| 2007/0229807 | A1 | 10/2007 | Lally et al. |
| 2008/0311688 | A1 | 12/2008 | Yamashita et al. |
| 2013/0071957 | A1 | 3/2013 | Wang et al. |
| 2014/0199849 | A1 | 7/2014 | Mani et al. |
| 2014/0252486 | A1 | 9/2014 | Lin et al. |
| 2014/0285980 | A1 | 9/2014 | Cappellani et al. |
| 2015/0060957 | A1 | 3/2015 | Lee et al. |
| 2015/0214368 | A1 | 7/2015 | Chang et al. |
| 2015/0318282 | A1* | 11/2015 | Rodder ............. H01L 27/0886 |
| | | | 438/275 |
| 2016/0043079 | A1 | 2/2016 | Chang et al. |
| 2016/0111531 | A1 | 4/2016 | Dong |
| 2017/0005005 | A1 | 1/2017 | Chen et al. |
| 2017/0330955 | A1 | 11/2017 | Rahhal-Orabi et al. |
| 2020/0006148 | A1 | 1/2020 | Chen et al. |

FOREIGN PATENT DOCUMENTS

| | | |
|---|---|---|
| KR | 1020050008687 A | 1/2005 |
| KR | 1020060060276 A | 6/2006 |
| KR | 1020090005122 A | 1/2009 |
| KR | 1020140111577 A | 9/2014 |
| WO | 2016105348 A1 | 6/2016 |

* cited by examiner

FinFET DEVICE AND METHOD OF FORMING AND MONITORING QUALITY OF THE SAME

PRIORITY CLAIM

This application is a continuation of U.S. patent application Ser. No. 17/074,532, filed on Oct. 19, 2020 and entitled "FinFET Device and Method of Forming and Monitoring Quality of the Same," which is a continuation of U.S. patent application Ser. No. 16/051,293, filed on Jul. 31, 2018 and entitled "FinFET Device and Method of Forming and Monitoring Quality of the Same" (now U.S. Pat. No. 10,811,536), which is a divisional of U.S. patent application Ser. No. 15/002,287, filed on Jan. 20, 2016, now U.S. Pat. No. 10,096,712 issued on Oct. 9, 2018, and entitled "FinFET Device and Method of Forming and Monitoring Quality of the Same" which application claims priority to U.S. Provisional Patent Application No. 62/244,087 filed on Oct. 20, 2015 and U.S. Provisional Patent Application No. 62/261,746, filed on Dec. 1, 2015, all of which applications are herein incorporated by reference.

BACKGROUND

Semiconductor devices are widely used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits.

To address the increase of manufacturing complexity and the accompanied problems in manufacturing process, advances in IC processing and manufacturing are necessary. For example, a three dimensional transistor, such as a fin-like field-effect transistor (Fin-FET), has been introduced to replace a planar transistor. In the manufacturing process of the Fin-FET devices, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
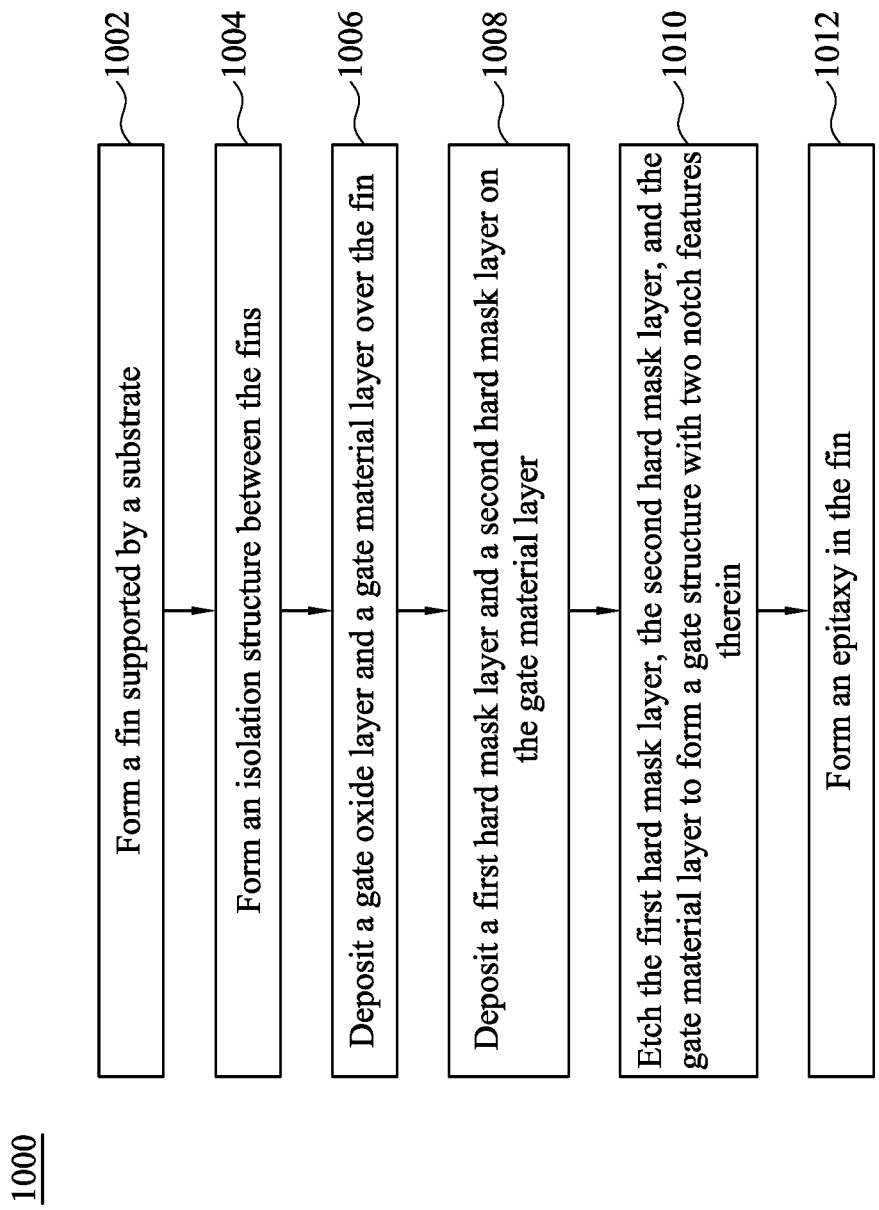
FIG. 1 illustrates an exemplary flow chart for manufacturing a FinFET device in accordance with the embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The singular forms "a," "an" and "the" include plural referents unless the context clearly dictates otherwise. Therefore, reference to, for example, a conductive plug includes aspects having two or more such plug, unless the context clearly indicates otherwise. Further, spatially relative terms, such as "beneath," "below," "lower," "above," "upper" and the like, may be used herein for ease of description to describe one element or feature's relationship to another element(s) or feature(s) as illustrated in the figures.

In the manufacture of a semiconductor device, it is very important for an integrated circuit to operate in a stable condition, thus any possibility of causing short circuit should be avoided. In a fin field-effect transistor (FinFET), one of such short circuit may occur between a source/drain area in a fin structure and a gate structure wrapping the fin. In a normal situation, during forming the gate structure wrapping the fin structure, a removing process such as etching is controlled to remove a gate material layer to form a desired shape of the gate structure. However, in a traditional etching way to form the gate structure, the gate structure in a center area of a substrate and the gate structure in a periphery area of the substrate are under different etching rate. Such different etching rate may cause different profiles of gate structures in the periphery area with respect to the gate structures in the center area. For example, the gate structure in the periphery area may be under etched which may result in a footing feature (or a gate protrusion) extending from a lower portion of the gate structure. The footing feature may cause a short circuit between the gate structure and a source/drain area formed subsequently.

To solve the problem of short circuit between the gate structure and the source/drain area that is caused by the footing feature of the gate structure, a method is provided to make gate structures in both the center area and the periphery area have two notch features therein. In the disclosure, a different flow rate of etching gas at the center area compared to the periphery area during a dry plasma etching process is applied to improve the etching process (i.e. increasing etching rate) at the periphery area. In addition, by properly adjusting other etching parameters, such as etching pressure, RF bias voltage, and over etching time, gate structures in the center area and in the periphery area both have the two notch features with a same profile. In particular, the dimension (or a set of distances) of the notch features may be controlled in a predetermined criterion. Thus the FinFET device will have a good electrical property which can be measured from a wafer acceptance test (WAT) procedure.

Now referring to FIG. 1, which is an exemplary flow chart for manufacturing a FinFET device according to one embodiment of the present disclosure. The flow chart illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

As shown in FIG. 1, an embodiment method 1000 of forming two notch features in a gate structure of a FinFET is provided. In step 1002, a fin supported by a substrate is formed. In step 1004, an isolation structure is formed between the fins. In step 1006, a gate oxide layer and a gate material layer are deposited over the fin. In step 1008, a first hard mask layer and a second hard mask layer are deposited on the gate material layer. In step 1010, the second hard mask layer, the second hard mask layer, and the gate material layer are etched to form a gate structure with two notch features therein. In step 1012, an epitaxy is formed in the fin.

Figure 2:
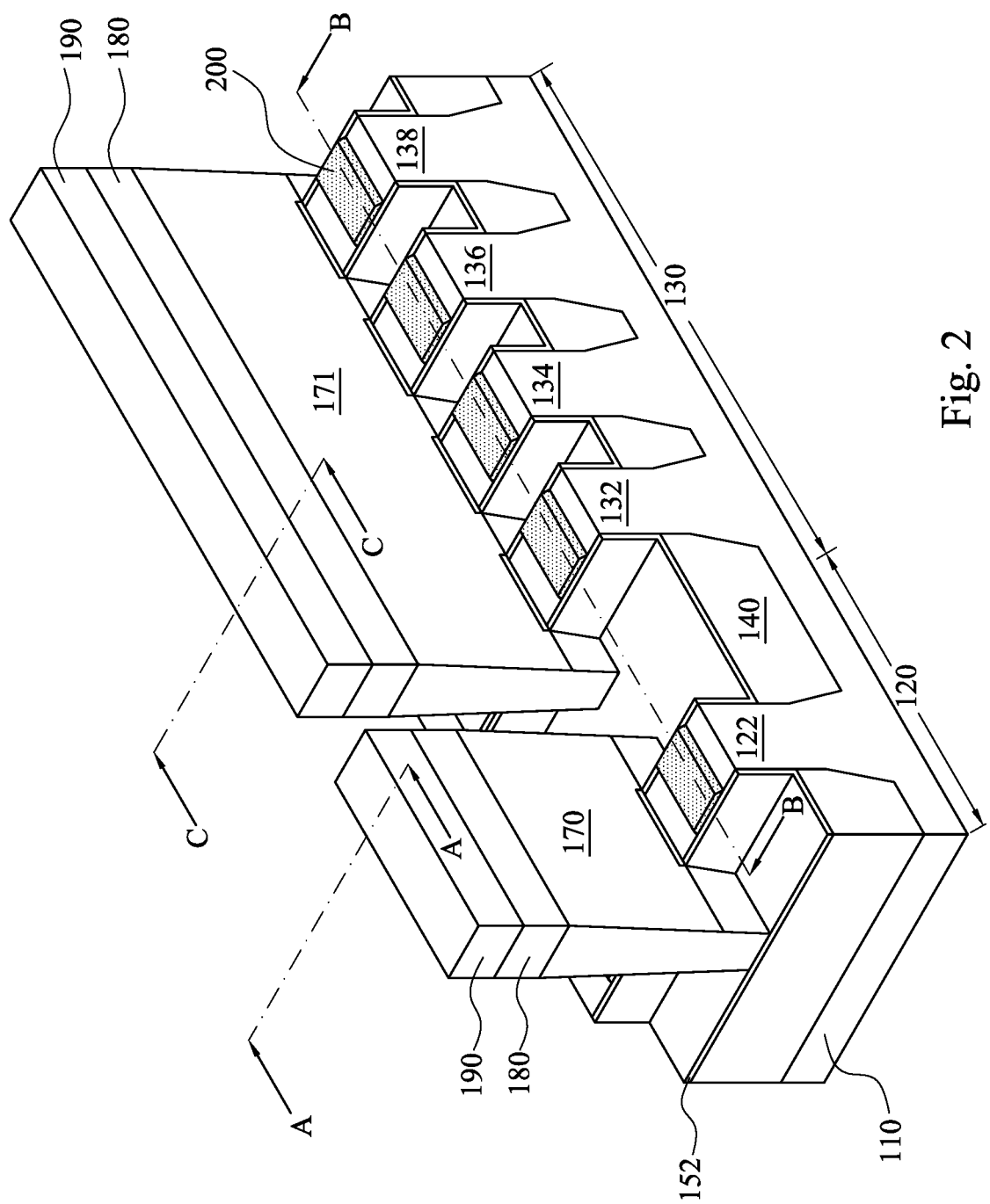
FIG. 2 illustrates a three dimensional view of a FinFET device in accordance with the embodiment.
Figure 3A:
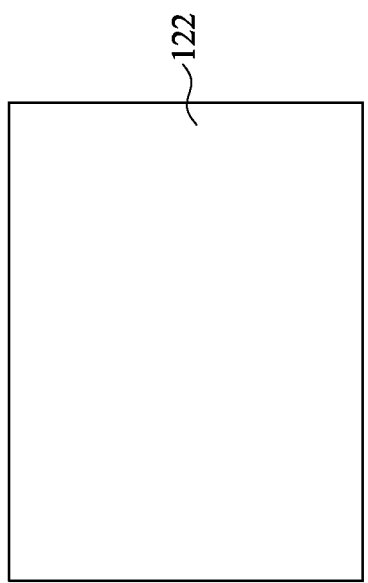
FIGS. 3A, 4A, 5A, 6A, and 7A illustrate various cross sectional views of a FinFET device along line A-A in FIG. 2 at different stages of manufacturing processes in accordance with the embodiments.
Figure 3B:
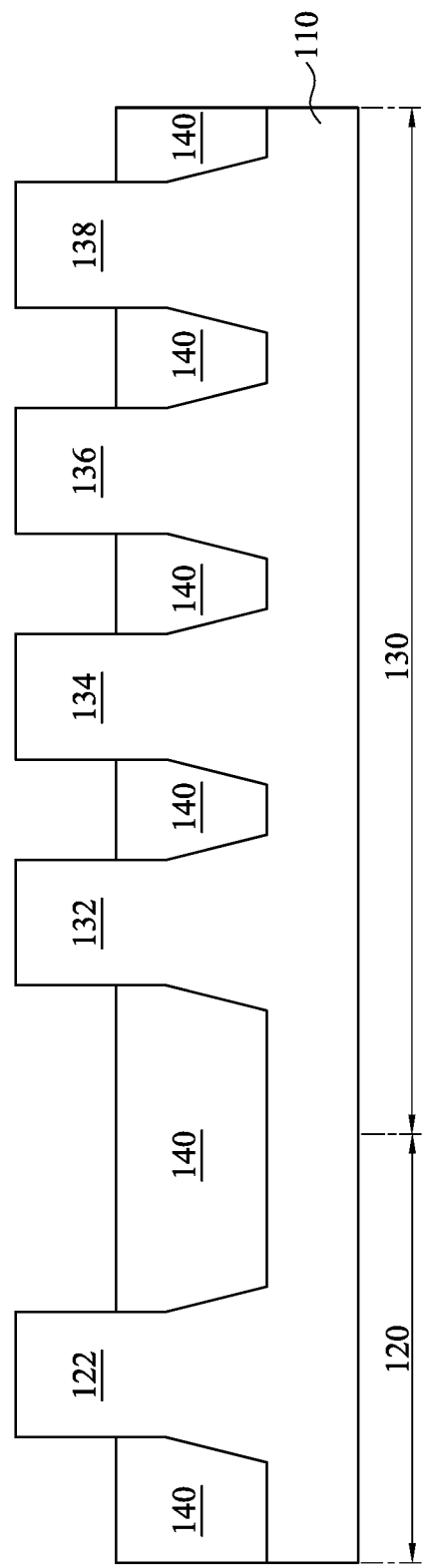
FIGS. 3B, 4B, 5B, 6B, and 7B illustrate various cross sectional views of a FinFET device along line B-B in FIG. 2 at different stages of manufacturing processes in accordance with the embodiments.
Figure 4A:
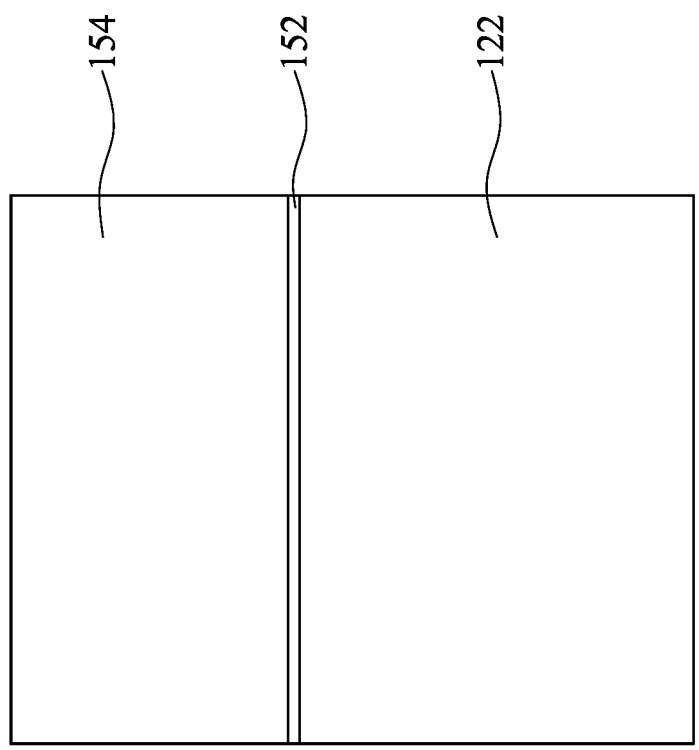
Figure 4B:
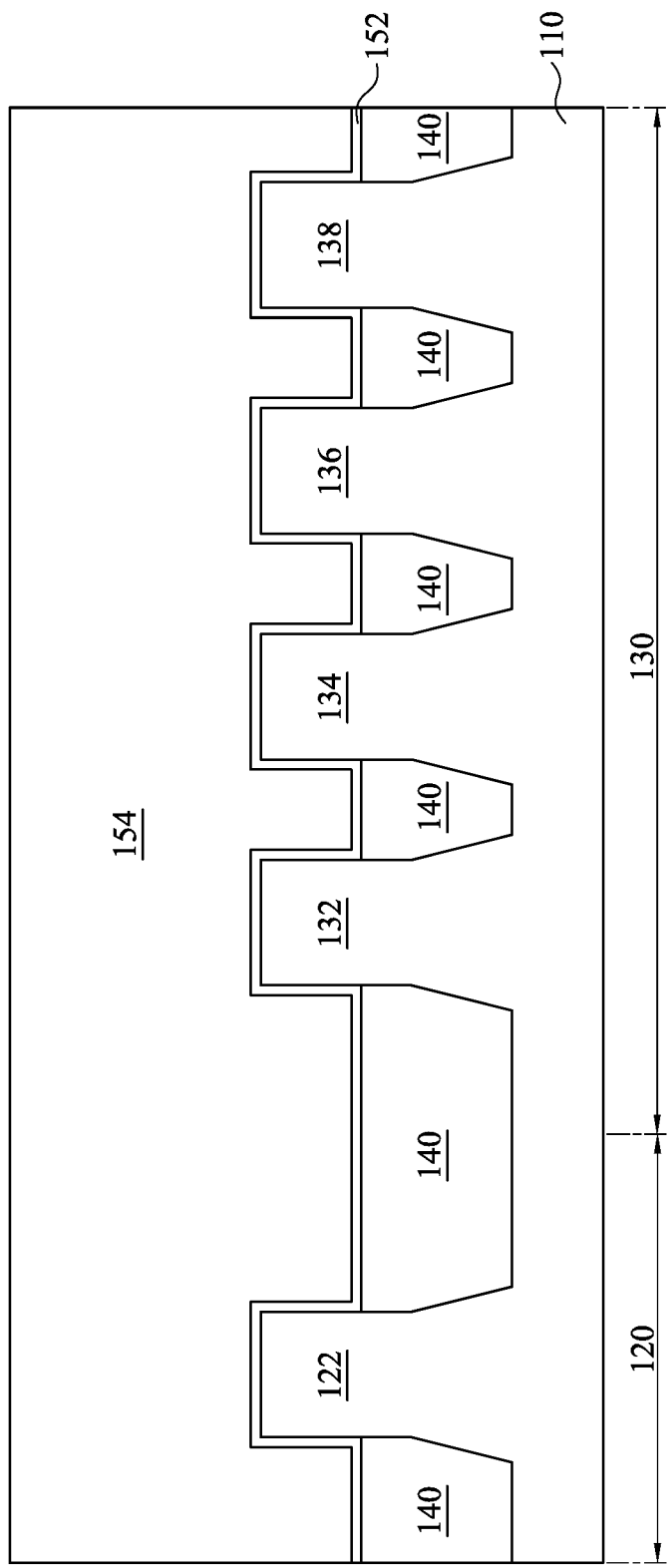
Figure 5A:
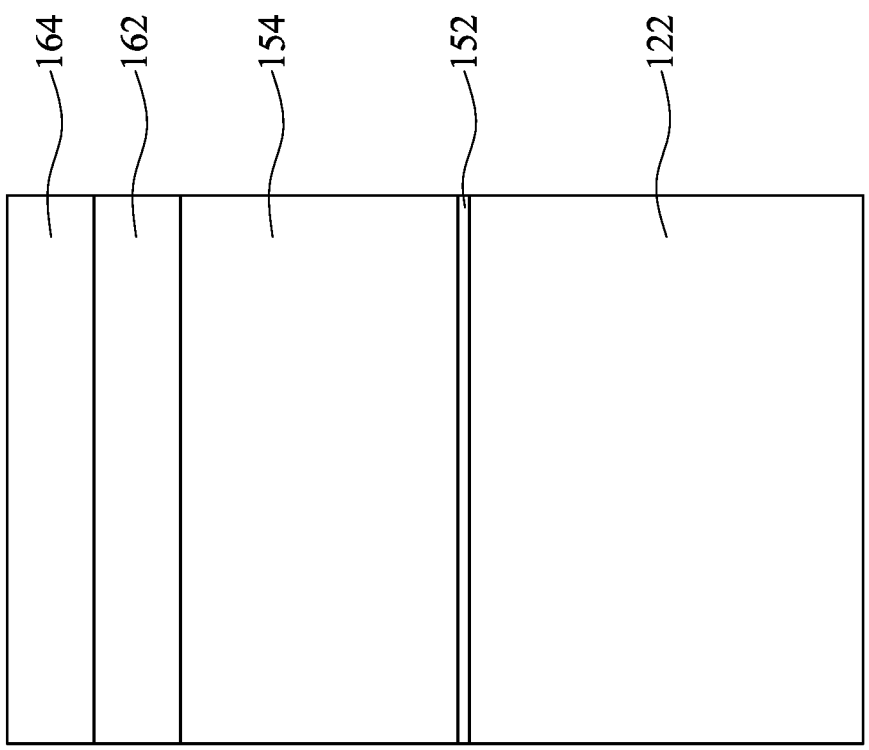
Figure 5B:
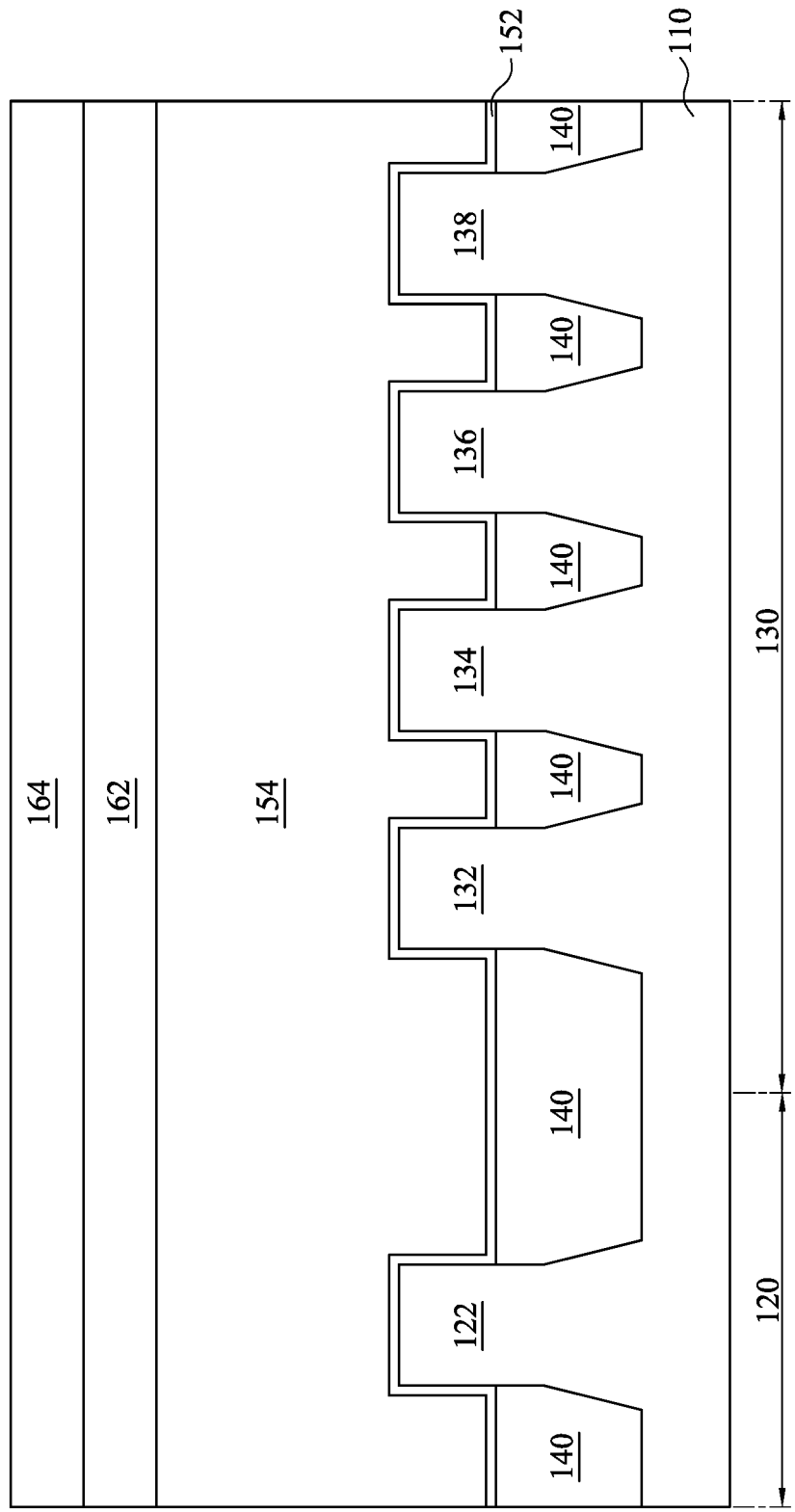

Referring to FIG. 2, a three dimensional view of a FinFET device with a gate structure having two notch features therein is provided first for understanding the present disclosure more easily and clearly. In the following discussions related to a the method 1000 of forming the FinFET device, a plurality of cross sectional views of the FinFET device along line A-A, line B-B, and line C-C are shown in FIG. 3A to FIG. 7A, FIG. 3B to FIG. 7B, and FIG. 6C to FIG. 7C respectively for best understanding the present disclosure.

Referring to FIGS. 1, 2, 3A, and 3B, the method 1000 starts from step 1002 by forming fins 122, 132, 134, 136, and 138 supported by a substrate 110. The substrate 110 comprises two areas: a center area 120 with the fin 122 thereon; and a peripheral area 130 with the fins 132, 134, 136, and 138 thereon. It should be noticed that the center area 120 and the peripheral area 130 may located at either a dense area or an iso area respectively, wherein the dense area is defined to be an area with a high density of fins thereon, while the iso area is defined to be an area with a low density of fins thereon. In other embodiments, the substrate 110 comprises a dense area 130 and an iso area 120. Furthermore, the dense area 130 and the iso area 120 may both located at a center area of the substrate 110 or a peripheral area of the substrate 110.

The substrate 110 may be a bulk silicon substrate. Alternatively, the substrate 100 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or a combination thereof. Further, the substrates 110 may also include a silicon-on-insulator (SOI) substrate. Generally, an SOI substrate comprises a layer of a semiconductor material such as silicon (Si), germanium (Ge), silicon germanium (SiGe), silicon germanium on insulator (SGOI), or a combination thereof. The SOI substrate 100 is fabricated using separation by implantation of oxygen (SIMOX), wafer bonding, and/or other suitable methods. Other substrates that may be used include multi-layered substrates, gradient substrates, or hybrid orientation substrates. In the embodiment, the substrate 110 is a bulk silicon substrate. That is to say, fins 122, 132, 134, 136, and 138 are physically connected to the substrate 110.

Still referring to FIGS. 1, 2, 3A, and 3B, the method 1000 proceeds to step 1004 by forming an isolation structure 140 between fins 122, 132, 134, and 138. The isolation structure 140 functions as an insulating layer or an isolation layer for separating two active areas comprising such as epitaxy 200 in the fins 122, 132, 134, and 138. The isolation structure 140 may comprise any suitable insulating materials such as, for example but not limited to, silicon oxide ($SiO_2$), silicon nitride (SiN), silicon oxynitride (SiON), fluoride-doped silicate glass, a low-k dielectric material, and a combination thereof. As used herein, the term "low-k dielectric" refers to the material having a dielectric constant, k, smaller than about 3.9, which is the k value of $SiO_2$. The isolation structure 140 may also comprise flowable material such as, for example, silicate, siloxane, methyl SilsesQuioxane (MSQ), hydrogen SisesQuioxane (HSQ), MSQ/HSQ, perhydrosilazane (TCPS), perhy-dro-polysilazane (PSZ), a tetraethyl orthosilicate (TEOS), or a silyl-amine, such as trisilylamine (TSA).

Referring to FIGS. 1, 2, 4A, and 4B, the method 1000 proceeds to step 1006 by depositing a gate oxide layer 152 on the fins and a gate material layer 154 on the gate oxide layer 152. The gate oxide layer 152 may comprise LaO, AlO, ZrO, TiO, $SiO_2$, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. While the gate material layer 154 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In some embodiments, the gate oxide layer 152 and the gate material layer 154 are formed by a deposition process, such as chemical vapor deposition (CVD).

Referring to FIGS. 1, 2, 5A, and 5B, the method 1000 proceeds to step 1008 by depositing a first hard mask layer 162 on the gate material layer 154 and a second hard mask layer 164 on the first hard mask layer 162. The first hard mask layer 164 and the second hard mask layer may comprise a same material or a different material selected from SiC, SiCN, SiN, TaO, $TiO_2$, $SiO_2$, $Si_3N_4$, SiON, any suitable material, or a combination thereof. In some embodiments, the first hard mask layer 162 and the second hard mask layer 164 are formed by a deposition process, such as chemical vapor deposition (CVD). In other embodiments, the first hard mask layer 162 may comprise a multiple structure. In yet other embodiments, only a hard mask layer such as the first mask layer 162 is formed on the gate material layer 154.

Referring to FIGS. 1, 2, and 6A-6C, the method 1000 proceeds to step 1010 by etching the second hard mask layer 164, the second hard mask layer 162, and the gate material layer 154 to form gate structures 170 and 171 with two notch features therein. Before performing the etching process of step 1006, the first hard mask layer 162 and the second hard mask layer 164 are patterned through a suitable photolithographic process to form a pattern thereon. Followed by an etching process to form the gate structure 170 and 171 as well as a first hard mask 180 and a second hard mask 190 on the gate structure 170 and 171.

The etching process may comprise dry etching, wet etching, plasma etching, reactive-ion etching, a combination thereof, or other suitable processes. The etching gas used in the etching process may comprise HBr, $CF_4$, $CHF_3$, $CH_4$, $CH_2F_2$, $N_2H_2$, $BCl_3$, $Cl_2$, $N_2$, $H_2$, $O_2$, He, Ar, and a combination thereof. To make the gate structure 170 in the center area 120 and the gate structure 171 in the peripheral area 130 both have two notch features with a same profile, some etching parameters needs to be tuned. The etching parameters of a dry plasma etching process may include etching temperature, etching pressure, source power, RF bias voltage, RF bias power, gas flow, over etching time, and other suitable parameters. In the embodiment, the gas flow is not uniform at a center area 120 and a peripheral area 130. In the embodiment, the ratio of the gas flow at the center area to the gas flow at the peripheral area is in a range between about 0.2 to about 1. In some embodiments, the ratio is less than 0.2. That is to say, the gas flow at the peripheral area 130 is larger than that at the center area 120 so that an etching rate of the gate material layer 154 at the peripheral area 130 is as similar as that in the center area 120. It should be noticed that a higher etching rate of the gate material layer 154 at the peripheral area 130 improves an under etching situation in the peripheral area 130 in the traditional etching way (i.e. same gas flow at the peripheral area 130 and at the center area 120) and avoid a footing feature which may cause a short circuit issue from occurring.

Furthermore, other parameters of the dry plasma etching process may improve the etching process of the gate material layer 154. In the embodiment, the etching pressure is in a range between about 13 mtorr and about 20 mtorr. In some embodiments, the etching pressure is higher than about 20 mtorr or lower than about 13 mtorr. In the embodiment, the RF bias voltage is in a range between about 160 V and about 180 V. In some embodiments, the RF bias voltage is higher than about 180 V or less than about 160 V. In the embodiment, the over etching time is in a range between about 30 seconds to about 32 seconds. In some embodiments, the over etching time is longer than about 32 seconds or shorter than 30 seconds. By applying these etching parameters, an under etching situation occurred in the peripheral area 130 in a traditional way may be improved to avoid the footing feature.

In addition, by properly choosing parameters of an etching process, the gate structures 170 and 171 at either a dense area or an iso area of a center area or a peripheral area both have two notch features in a first portion and a second portion of the gate structures 170 and 171 respectively.

Figure 6A:
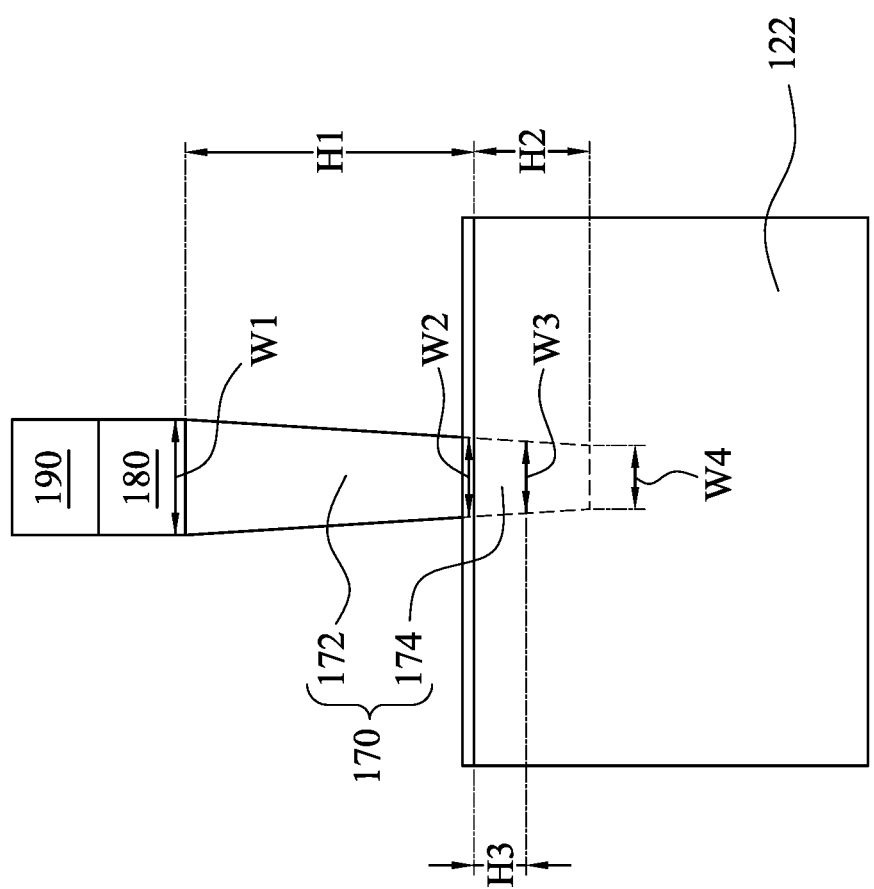
Figure 6B:
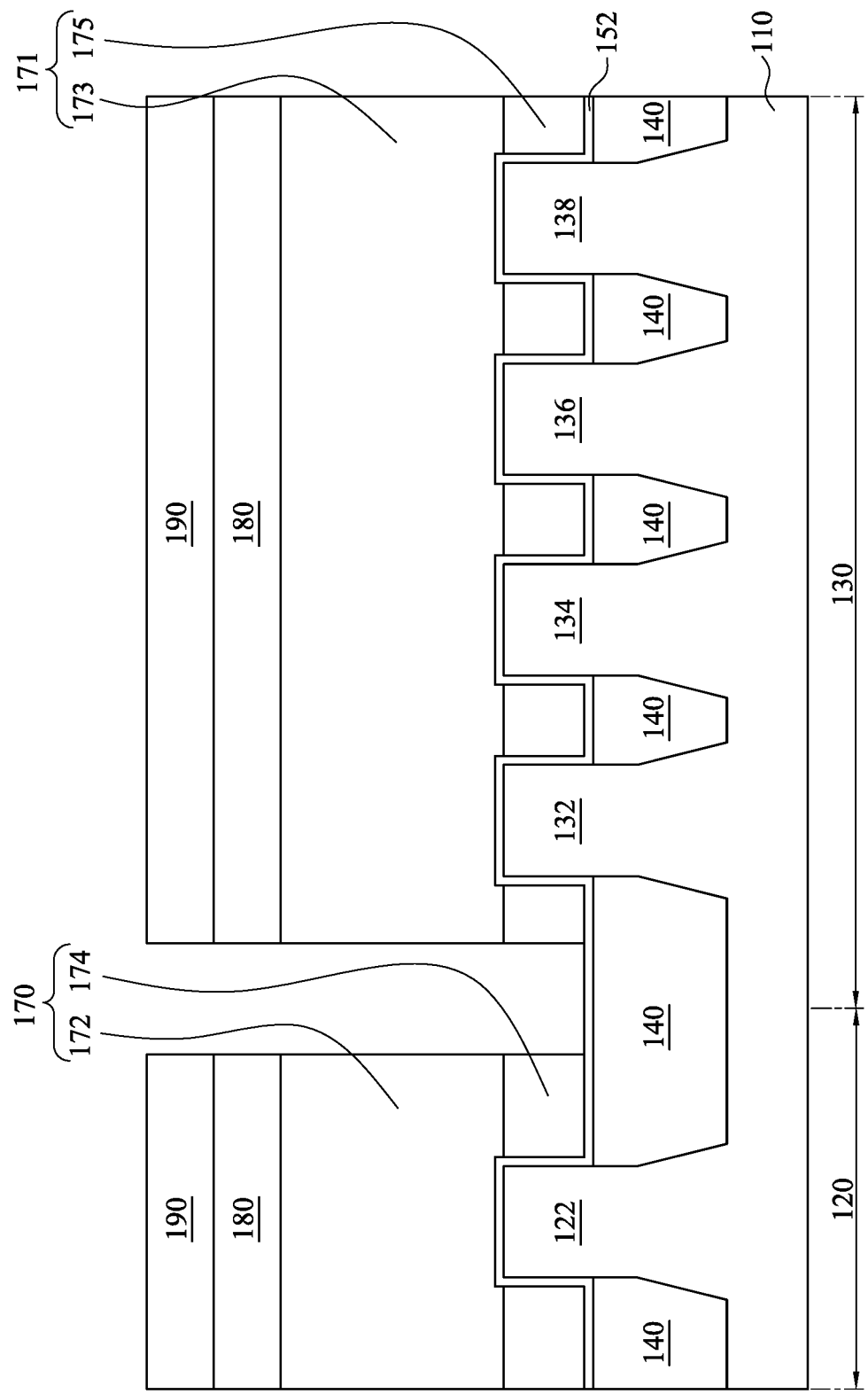

Referring to FIG. 6A, the gate structure 170 in the center area 120 has a first portion 172 over the fin 122 and a second portion 174 overlapped with sidewalls of the fin 122. That is to say, the gate structure 170 is separated into two parts connected to each other. And the bottom surface of the first portion 172 is overlapped with the top surface of the second portion 174. The notch feature in the first portion 172 comprises a set of distances comprising a first width (W1) at a top surface of the first portion 172 and a first height (H1) from a top surface of the first portion 172 to the fin 122. On the other hand, the notch feature in the second portion 174 comprises a set of distances comprising a second width (W2) at a top surface of the second portion 174, a third width (W3) at a middle position of the second portion 174, a fourth width (W4) at a bottom surface of the second portion 174, a second height (H2) from a bottom surface of the second portion 174 to the fin 122, and a third height (H3) form a middle position of the second portion 174 to the fin 122. It should be noticed that each of the set of distances mentioned above is referenced to the second width (W2), and a relative position between any two of the set of the distances can be calculated and known by the aforementioned definitions of the set of distances.

Figure 6C:
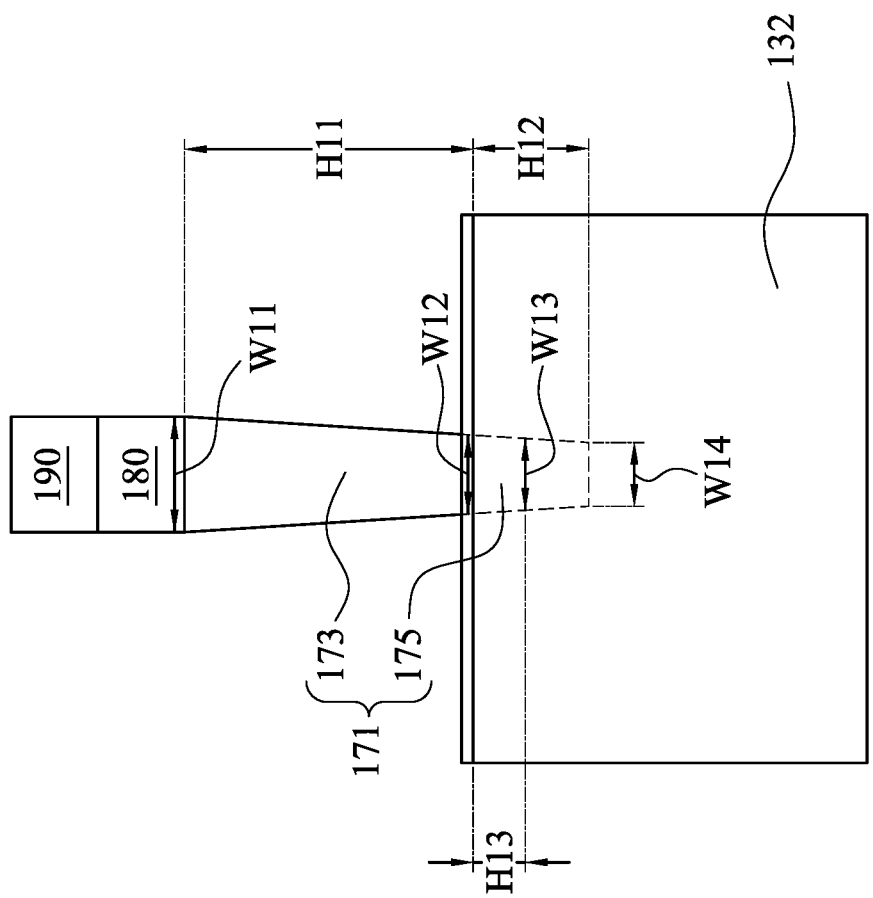
FIGS. 6C and 7C illustrate various cross sectional views of a FinFET device along line C-C in FIG. 2 at different stages of manufacturing processes in accordance with the embodiments.

Referring to FIG. 6C, the gate structure 171 in the peripheral area 130 has a first portion 173 over the fin 132 and a second portion 175 overlapped with sidewalls of the fin 132. That is to say, the gate structure 171 is separated into two parts connected to each other. And the bottom surface of the first portion 173 is overlapped with the top surface of the second portion 175. The notch feature in the first portion 173 comprises a set of distances comprising first width (W11) at a top surface of the first portion 173 and a first height (H11) from a top surface of the first portion 173 to the fin 132. On the other hand, the notch feature in the second portion 175 comprises a set of distances comprising a second width (W12) at a top surface of the second portion 175, a third width (W13) at a middle position of the second portion 175, a fourth width (W14) at a bottom surface of the second portion 175, a second height (H12) from a bottom surface of the second portion 175 to the fin 132, and a third height (H13) form a middle position of the second portion 175 to the fin 132.

In the embodiment, the gate structure 170 and the gate structure 171 have the notch features with the same profile (or the same set of distances) in the first portion 172 and 173 and in the second portion 174 and 175 respectively. Furthermore, the set of distances of the notch features of the gate structures 170 and 171 mentioned above may be used in a comparison with a predetermined criterion for obtaining a quality related to electric properties of the FinFET device, which will be discussed later.

Figure 7A:
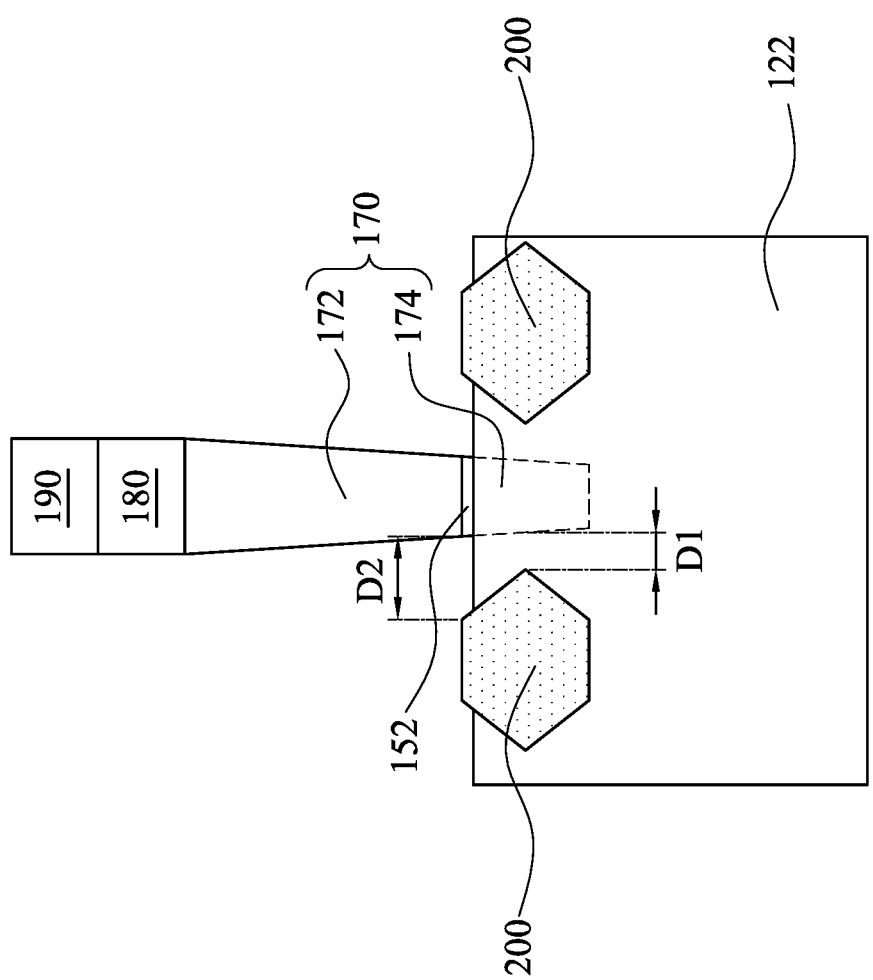
Figure 7B:
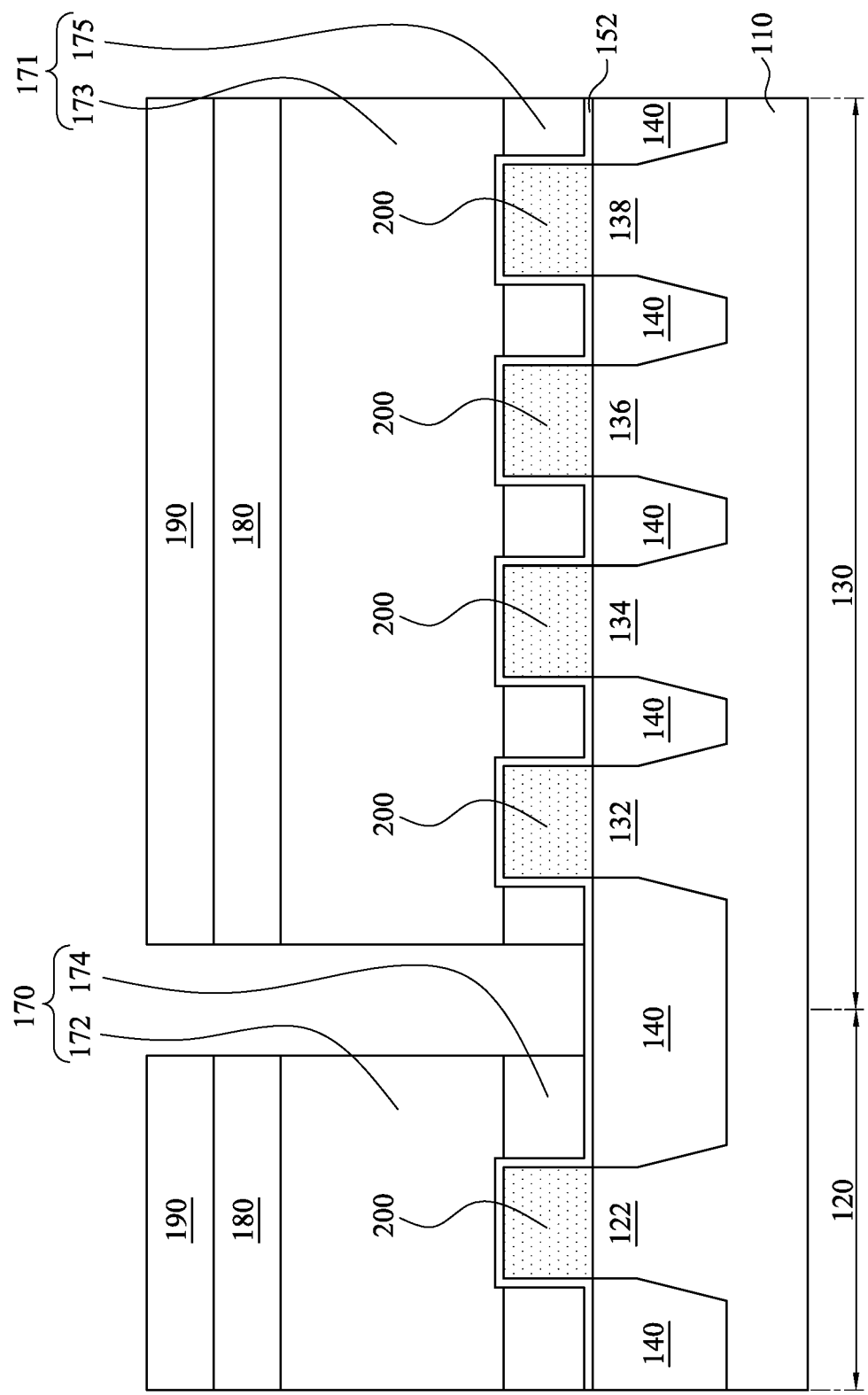
Figure 7C:
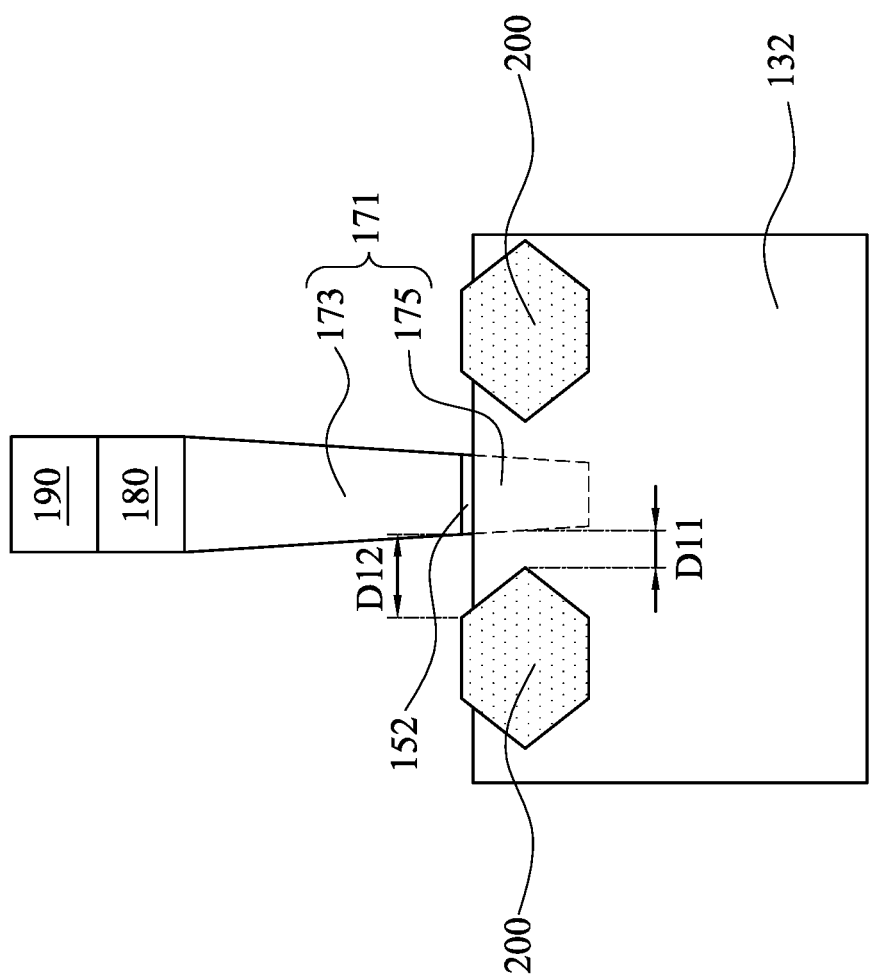

Referring to FIGS. 1, 2, and 7A-7C, the method 1000 proceeds to step 1012 by forming epitaxy 200 in the fins 122 and 132 respectively. The epitaxy 200 may be formed by depositing a crystalline in a recess (not shown) of the fins 122 and 132. As shown in FIG. 7A, there is a distance D1 between the epitaxy 200 and the second portion 174 of the gate structure 170, and a distance D2 between the epitaxy 200 and the first portion 172 of the gate structure 170. On the other hand, as shown in FIG. 7C, there is a distance D11 between the epitaxy 200 and the second portion 175 of the gate structure 171, and a distance D12 between the epitaxy 200 and the first portion 173 of the gate structure 171. The distance D1, D2, D11 and D12 should be precisely controlled to avoid short circuit from occurring. In the embodiment, the notch feature in the second portion 174 and 175 of the gate structure 170 and 171 may provide a larger distance D1 and D11 so that a process window may be enlarged and a stability of a semiconductor device may be increased. Furthermore, the notch feature in the first portion 172 and 173 of the gate structure 170 and 171 may also provide a larger distance D2 and D12, thus a short circuit issue caused by a footing feature may be avoided as well.

Figure 8:
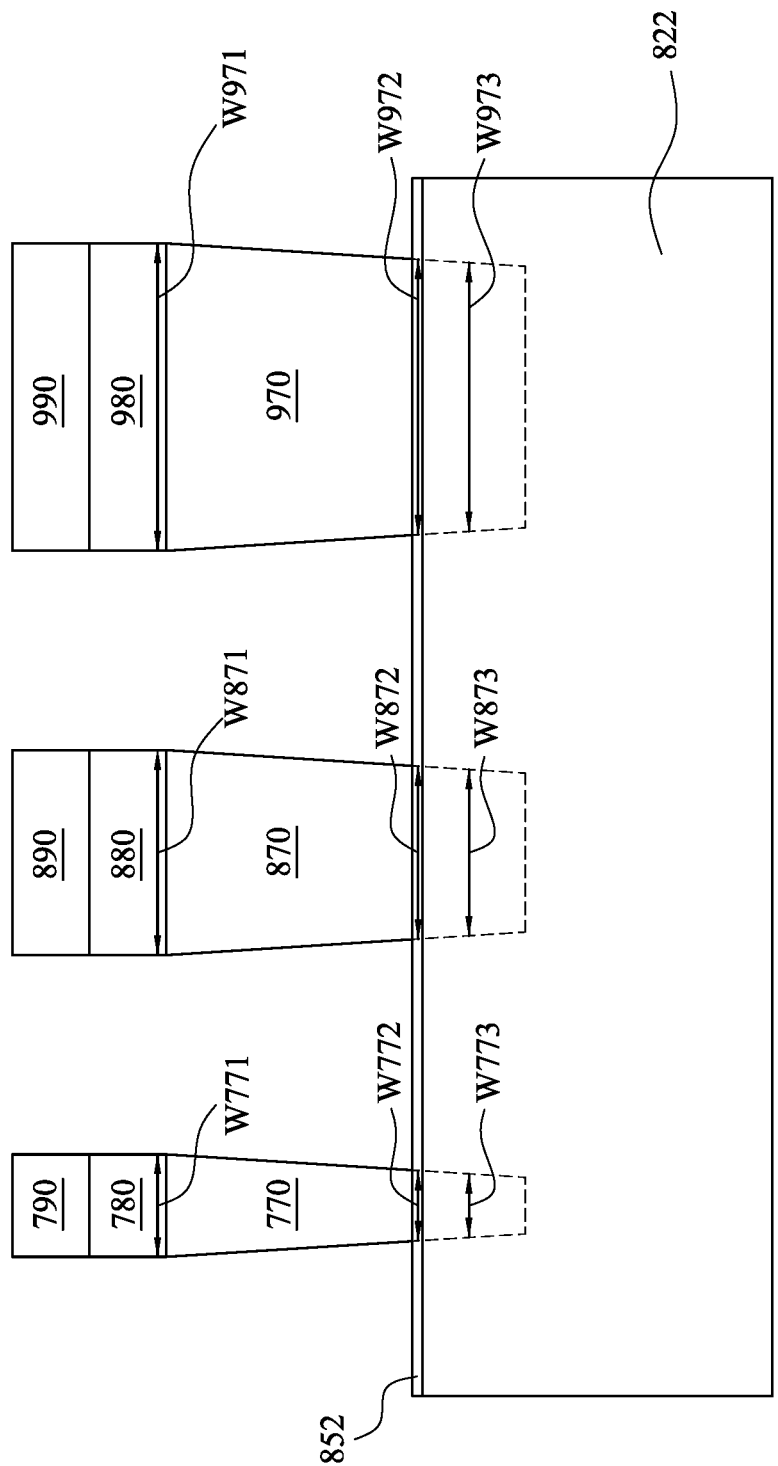
FIG. 8 illustrate a cross sectional views of a FinFET device in accordance with the embodiments.

In other embodiments as shown in FIG. 8, gate structures may comprise different width, thus different channel lengths may be formed under gate structures for design requirements. As shown in FIG. 8, gate structures comprising a short channel gate 770, a middle channel gate 870, and a long channel gate 970 are formed on a fin 822 and a gate oxide layer 852. In addition, each gate structure 770, 870, and 970 comprises a first hard mask 780, 880, and 980 and a second hard mask 790, 890, and 990 respectively. By using the etching method with particular etching parameters mentioned above, the short channel gate 770, the middle channel gate 870, and the long channel gate 970 can have two notch features with a same profile therein. To be more precisely, a difference between each one of the set of distance of the notch features mentioned above in FIG. 6 is the same among the short channel gate 770, the middle channel gate 870, and the long channel gate 970. For example, a difference between a first width (W771) and a second width (W772) of the short channel gate 770 is equal to a difference between a first width (W871) and a second width (W872) of the middle channel gate 870. And a difference between a second width (W772) and a third width (W773) of the short channel gate 770 is equal to a difference between a second width (W872) and a third width (W873) of the middle channel gate 870. Also, a difference between a second width (W872) and a third width (W873) of the middle channel gate 870 is equal to a difference between a second width (W972) and a third width (W973) of the long channel gate 970. And a difference between a first width (W871) and a second width (W872) of the middle channel gate 870 is equal to a difference between a first width (W971) and a second width (W972) of the long channel gate 970. Thus, the etching method with particular parameters mentioned above can be used to form the same difference between any two distances of the set of distances when comparing gate structures with different gate width.

Figure 9:
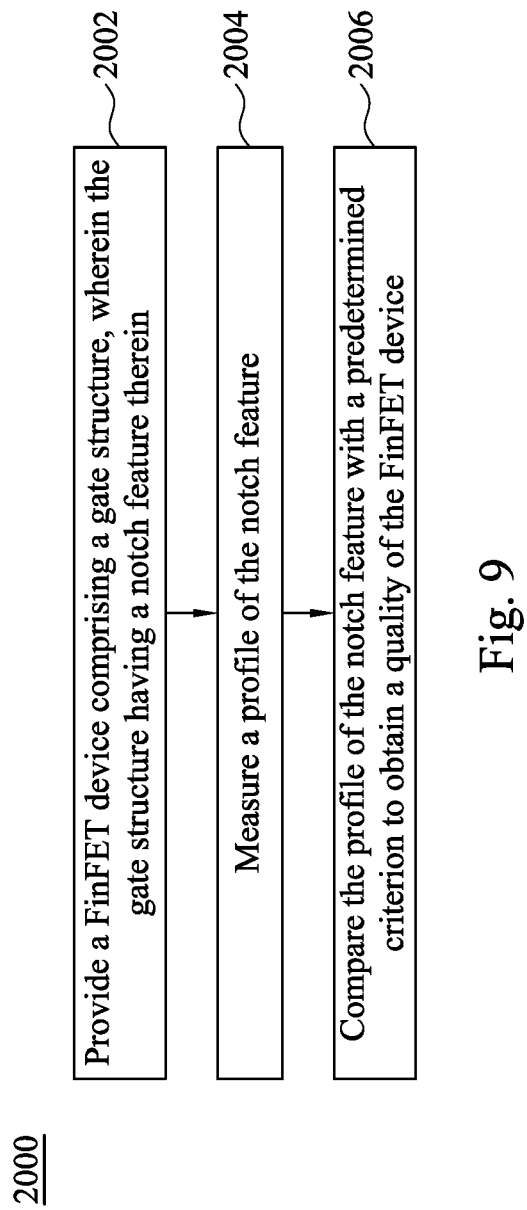
FIG. 9 illustrates an exemplary flow chart of monitoring a quality of a FinFET device in accordance with the embodiments.

Now referring to FIG. 9, which is an exemplary flow chart of monitoring a quality of a FinFET device according to one embodiment of the present disclosure. The flow chart illustrates only a relevant part of the entire manufacturing process. It is understood that additional operations may be provided before, during, and after the operations shown by FIG. 9, and some of the operations described below can be replaced or eliminated for additional embodiments of the method. The order of the operations/processes may be interchangeable.

Referring to FIG. 9, the method 2000 of monitoring a quality of a FinFET device starts from step 2002 by providing a FinFET device comprising a gate structure having a notch feature therein. The FinFET device may be provided by the manufacturing method 1000 mentioned above in FIG. 1. Alternatively, the FinFET device may be received from other embodiments. The method 2000 discussed herein only refers to a monitoring method regardless of a source of the FinFET device.

Referring to FIG. 9, the method 2000 proceeds to step 2004 by measuring a profile of the notch feature in the gate structure. The method of measuring the profile of the notch feature may be an inline inspection. The measuring method may use a TEM method comprising slicing the substrate including the notch feature and then performing an electron microscope scanning to measure the profile of the notch feature. By observing a cross sectional TEM image of the notch feature, each distance of the set of distances mentioned above in FIG. 6 can be obtained directly and precisely. Alternatively, the measuring method may use an optical critical-dimension (OCD) inspection. The OCD measuring method comprises irradiating a notch feature with an incident electromagnetic wave, receiving an emitted electromagnetic wave from the notch feature after an interaction between the incident electromagnetic wave and the notch feature, and obtaining the profile of the notch feature by calculating a polarization change between the incident electromagnetic wave and the emitted electromagnetic wave. The OCD inspection can be used to provide a non-destructive measurement for obtaining the distance of the set of distances mentioned above.

Referring to FIG. 9, the method 2000 proceeds to step 2006 by comparing the profile of the notch feature with a predetermined criterion for obtaining a quality of the FinFET device. After the profile and each distance of a set of distances mentioned above in FIG. 6A are obtained by the method discussed in the step 2004, the distance of a set of distances of the notch feature is compared with a predetermined criterion. It should be noticed that each distance of a set of distance of the notch feature in FIG. 6A is used for easily and clearly understanding the predetermined criterion. The predetermined criterion comprise following conditions: the first width (W1) is larger than the second width (W2); the second width (W2) is larger than the third width (W3), wherein the difference between the second width (W2) and the third width (W3) is in a range between about 0.001 nm and about 15 nm; and the first height (H1) is larger than the second height (H2), wherein the second height (H2) is in a range between about 0.001 nm and about 50 nm. Since the third width (H3) is half of the second height (H2), the third width (H3) is in a range between about 0.001 nm and about 25 nm. It should be noticed that the fourth width (W4) is not limited in the predetermined criterion, thus a width of the fourth width (W4) may be larger than the third width (W3) or smaller than the third width (W3). In the embodiment, the second portion 174 comprises smooth sidewalls with a same slope so that the fourth width (W4) is smaller than the third width (W3). It should be noticed that the criterion is applied to the notch feature of all gate structures in a FinFET device. It should be noticed that a half upper part of the second portion 174 having a specific profile, comprising a second width (W2), a third width (W3), and a third height (H3) as shown in FIG. 6A. Further, the second portion 174 has a slope on a sidewall thereof. The slope is defined as ratio of the third height (H3) to the difference between the second width (W2) and the third width (W3), and a positive slope represents a slope of the second portion 174 having a second width (W2) larger than the third width (W3), while a negative slope represents a slope of the second portion 174 having a second width (W2) smaller than the third width (W3). In the embodiment, the slope is in a range between 0.000067 and 25000. In some embodiments, the slope is in a range between 0.067 and 25. By controlling the slope of the second portion 174 of the gate structure 170, the gate structure 170 will operate normally and pass a WAT (wafer acceptance test).

Furthermore, once the distance of a set of distances of the notch feature meets the predetermined criterion mentioned above, items of a subsequent wafer acceptance test (WAT) also meet a predetermined standard value, thus proving that electrical properties and stability of a FinFET device is good or acceptable. The items of a WAT related to a gate structure may comprise Re, Cgd, Cgg, Rg, drain-induced barrier lowering (DIBL), and other test items.

As aforementioned, a method of forming gate structures having two notch features with a same profile is very important for improving electrical performance and stability of a semiconductor device. It is known that during a traditional way to etch a gate material layer to form gate structures may result in an uncontrollable dimension in gate structures locating in different zones (i.e. center/peripheral areas or dense/iso areas) of a substrate. The uncontrollable dimension of gate structure may lead to defects, such as short circuit caused by a footing feature of a gate structure, in some under-etched gate structures. Hence, a method is needed for improving dimension controlling of gate structures so as to prevent short circuit from occurring.

A method disclosed according to the embodiments to dissolve the problem described above of the dimension controlling of gate structures during an etching process of a gate material layer is providing a different gas flow at a center area and at a peripheral area of a substrate and tuning etching parameters such as etching pressure, bias power, and over etching time. By properly tuning a gas flow and other etching parameters, all formed gate structures have two notch features with a same profile. Furthermore, gate structures with different gate width also have two notch features with a same difference between each distance of a set of distances of the notch feature. In addition, the set of distances of the notch feature are correlated to wafer acceptance test (WAT) items. In other words, the set of distance of the notch features may provide information for determining a quality of a FinFET device. That is to say, once the distances of the set of distances of the notch feature meet a predetermined criterion, the related outcome WAT result will be good and acceptable. In summary, the method in the disclosure can form two notch features with a same profile in all gate structures. And the profile (or the set of distances) of the notch features all meet a predetermined criterion to have a good quality of a FinFET device.

In accordance with some embodiments of the present disclosure, a method of forming a FinFET structure, the method comprises: forming a plurality of fins supported by a substrate; depositing a gate layer on the fins; and etching the gate layer by plasma etching with an etching gas to form a gate having two notch features in a first portion over the fin and in a second portion overlapped with sidewalls of the fin. The substrate has a center area and a peripheral area. The etching gas during the plasma etching is supplied at a ratio of a flow rate at the center area to a flow rate at the periphery area in a range from 0.2 to 1.

In accordance with some embodiments of the present disclosure, a method of monitoring a quality of a FinFET device, the method comprising: providing the FinFET device comprising a fin supported by a substrate and a gate structure having a notch feature in a portion overlapped with sidewalls of the fin; measuring a profile of the notch feature; and obtaining the quality of the FinFET device by comparing the profile of the notch feature with a predetermined criterion.

In accordance with some embodiments of the present disclosure, a FinFET device comprises a substrate, a fin supported by the substrate, and a gate structure having two notch features. The two notch features are in a first portion over the fin and a second portion overlapped with sidewalls of the fin. A profile of the notch features comprises: a first width at a top surface of the first portion; a second width at a top surface of the second portion; a third width at a middle position of the second portion; a fourth width at a bottom surface of the second portion; a first height from the first width to the second width; a second height from the second width to the third width; and a third height from the third width to the fourth width. Wherein the third width is smaller than the second width and a difference between the third width and the second width is in a range between 0.001 nm and 25 nm; and the second height is in a range between 0.001 nm and 25 nm.

One general aspect of embodiments disclosed herein includes a FinFET device, the FinFET device including: a fin supported by a substrate; and a gate structure having two notch features individually in a first portion over the fin and a second portion overlapped with sidewalls of the fin, where a profile of the two notch features includes: a first width at a top surface of the first portion; a second width at a top surface of the second portion; a third width at a middle position of the second portion; a fourth width at a bottom surface of the second portion; a first height from the first width to the second width; a second height from the second width to the third width; and a third height from the third width to the fourth width, where the third width is smaller than the second width and a difference between the third width and the second width is in a range between 0.001 nm and 25 nm; and the second height is in a range between 0.001 nm and 25 nm.

One general aspect of embodiments disclosed herein includes a FinFET device, the FinFET device including: a fin supported by a substrate; and a first gate structure having two notch features individually in a first portion over the fin and a second portion overlapped with sidewalls of the fin, where a profile of the two notch features includes: a first width at a top surface of the first portion; a second width at a top surface of the second portion; a third width at a middle position of the second portion; a fourth width at a bottom surface of the second portion; a first height from the first width to the second width; a second height from the second width to the third width; and a third height from the third width to the fourth width, where the third width is smaller than the second width and a difference between the third width and the second width is in a range between 0.001 nm and 15 nm; and the second height is in a range between 0.001 nm and 50 nm, and further where the third height is about half the second height.

Yet another general aspect of embodiments disclosed herein includes a FinFET device including: at least one fin extending in a first longitudinal direction; a gate structure extending in a second longitudinal direction perpendicular to the first longitudinal direction, the gate structure having a notched profile when viewed in cross-section along the first longitudinal direction, the notched profile including: a first portion extending above the at least one fin top surface, the first portion having a sidewall that slopes from a first width W1 at a top height H1 to a second width W2 at a bottom height; and a second portion extending along a sidewall of the at least one fin, the second portion having a sidewall that slopes from the second width W2 at the top of the second portion to a third width W3 at a point a first distance H3 below the top of the second portion to a fourth width w4 at a point a second distance H2 below the top of the second portion; and where the following conditions are met by the profile of the gate structure: W1>W2>W3, H1>H2, H3=H2/2, and 0.067<H3/(W2−W3)<25.

Still another general aspect includes a method of forming a FinFET device, forming a plurality of fins supported by a substrate having a center area and a periphery area. The method also includes depositing a gate layer on the fins. The method also includes and etching the gate layer with an etching gas to form a first gate having a first profile in a first portion over a first fin and a second profile in a second portion overlapped with sidewalls of the first fin, where the etching gas is applied at a ratio in a range from 0.2 to 1 of a flow rate at the center area relative to a flow rate at the periphery area.

Yet still another aspect includes a method of forming a FinFET device, forming a plurality of fins extending from a semiconductor layer, the plurality of fins having a first fin density in a center area of the semiconductor layer and a second fin density different than the first fin density in a periphery area of the semiconductor layer. The method also includes depositing a gate layer on the plurality of fins. The method also includes and etching the gate layer to form a first gate over at least one first fin in the center area and a second gate over at least one second fin in the periphery area, by subjecting the gate layer to an etching gas at a first flow rate in the center area simultaneously with subjecting the gate layer to the etching gas at a second flow rate in the periphery area.

Further, still another general aspect includes a method of forming an integrated circuit having FinFET devices therein, forming a plurality of fins extending from a semiconductor layer, the plurality of fins having a first fin density in a center area of the semiconductor layer and a second fin density different than the first fin density in a periphery area of the semiconductor layer. The method also includes depositing a gate layer on the plurality of fins. The method also includes and etching the gate layer using an etching gas flowing at a first flow rate in the center area and a second flow rate in the periphery area to form over at least one first fin in the center area a first gate having a first profile and defining a first channel length, and to form over at least one second fin in the periphery area a second gate having the first profile and defining a second channel length greater than the first channel length.

Some embodiments described herein provide for a first transistor having a first channel length and having a first gate structure, the first gate structure having a first width at an upper portion of the first gate structure and a second width at a lower portion of the first gate structure. The integrated circuit also includes a second transistor having a second channel length longer than the first channel length and having a second gate structure, the second gate structure having a third width at an upper portion of the second gate structure and a fourth width at a lower portion of the second gate structure. The integrated circuit also includes a third transistor having a third channel length longer than the second channel length and having a third gate structure, the third gate structure having a fifth width at an upper portion of the third gate structure and a sixth width at a lower portion of the third gate structure. The integrated circuit also includes where a first difference between the first width and the second width is equal to a second difference between the third width and the fourth width.

Other embodiments described herein provide for a method of forming an integrated circuit, in a first region of a semiconductor substrate, forming a first plurality of parallel fins, the first plurality of parallel fins having a first spatial density. The method also includes in a second region of the semiconductor substrate, forming a second plurality of parallel fins, the second plurality of parallel fins having a second spatial density that is lesser than the first spatial density. The method also includes forming gate material extending over the first plurality of parallel fins and the second plurality of parallel fins. The method also includes etching the gate material in the first region and the second region simultaneously, using a same etch process, where at least one parameter of the etch process is different in the first region as compared to the second region.

Yet other embodiments described herein provide for a method of forming an integrated circuit, in a first region of a semiconductor wafer, forming a first plurality of fins having a first pattern density. The method also includes in a second region of the semiconductor wafer, forming a second plurality of fins having a second pattern density greater than the first pattern density. The method also includes forming gate electrode material on the first plurality of fins and the second plurality of fins. The method also includes performing an etch process on the gate electrode material, where at least one parameter of the etch process as applied in the first region differs from the parameter of the etch process as applied in the second region, to form a first gate electrode in the first region and a second gate electrode in the second region, the first and second gate electrodes having congruent sidewall profiles.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
   in a first region of a semiconductor substrate, forming a first plurality of parallel fins, the first plurality of parallel fins having a first spatial density;
   in a second region of the semiconductor substrate, forming a second plurality of parallel fins, the second plurality of parallel fins having a second spatial density that is lesser than the first spatial density;
   forming gate material extending over the first plurality of parallel fins and the second plurality of parallel fins; and
   etching the gate material in the first region and the second region simultaneously, using a same etch process, wherein at least one parameter of the etch process is different in the first region as compared to the second region.

2. The method of claim 1, wherein the at least one parameter is etch gas flow rate.

3. The method of claim 2, wherein the etch gas flow rate in the first region is in a range of from 0.2 to 1 of the etch gas flow rate in the second region.

4. The method of claim 2, wherein the etch gas is selected from the group consisting of HBr, $CF_4$, $CHF_3$, $CH_4$, $CH_2F_2$, $N_2H_2$, $BCl_3$, $Cl_2$, $N_2$, $H_2$, $O_2$, He, Ar, and combinations thereof.

5. The method of claim 2, wherein as a result of the etch gas flow rate, the rate of etch of the gate material in the first region is the same as the rate of etch of gate material in the second region.

6. The method of claim 1, wherein the step of etching the gate material forms respective gate structures, each having a first notch feature in a first portion over a respective fin and a second notch feature in a second portion extending along and overlapped with sidewalls of the respective fin.

7. The method of claim 6, wherein one gate structure defines a first gate length of a first transistor and another gate structure defines a second gate length of a second transistor, the second gate length being longer than the first gate length.

8. The method of claim 1, further comprising forming a patterned hard mask over the gate material before the step of etching the gate material.

9. The method of claim 1, wherein the step of etching the gate material in the first region and the second region simultaneously results in a first gate structure in the first region and a second gate structure in the second region, the first and second gate structures having congruent profiles.

10. A method of forming an integrated circuit, the method comprising:

in a first region of a semiconductor wafer, forming a first plurality of fins having a first pattern density;

in a second region of the semiconductor wafer, forming a second plurality of fins having a second pattern density greater than the first pattern density;

forming gate electrode material on the first plurality of fins and the second plurality of fins; and performing an etch process on the gate electrode material, wherein at least one parameter of the etch process as applied in the first region differs from the parameter of the etch process as applied in the second region, to form a first gate electrode in the first region and a second gate electrode in the second region, the first and second gate electrodes having congruent sidewall profiles.

11. The method of claim 10, wherein the at least one parameter is etch gas flow rate.

12. The method of claim 11, wherein the etch gas flow rate in the first region is 0.2 to 1 times the etch gas flow rate in the second region.

13. The method of claim 12, wherein the first gate electrode and the second gate electrode each has a sidewall with a partially vertical profile and a partially sloped profile.

14. The method of claim 13, wherein first gate electrode and the second gate electrode extend the same height above a common substrate.

15. The method of claim 11, further comprising forming a patterned hard mask on the gate electrode material before etching the gate electrode material.

16. An A method of forming an integrated circuit, the method comprising:

forming in a first region of a device, a first transistor having a first channel length and having a first gate structure, the first gate structure having a first width at an upper portion of the first gate structure and a second width at a lower portion of the first gate structure;

forming in a second region of a device, a second transistor having a second channel length longer than the first channel length and having a second gate structure, the second gate structure having a third width at an upper portion of the second gate structure and a fourth width at a lower portion of the second gate structure;

forming in a third region of a device, a third transistor having a third channel length longer than the second channel length and having a third gate structure, the third gate structure having a fifth width at an upper portion of the third gate structure and a sixth width at a lower portion of the third gate structure;

wherein a first difference between the first width and the second width is equal to a second difference between the third width and the fourth width;

wherein forming the first gate structure and the second gate structure includes depositing gate material extending over the first region and the second region; and etching the gate material in the first region and the second region simultaneously, using a same etch process, wherein at least one parameter of the etch process is different in the first region as compared to the second region.

17. The method of claim 16, further comprising forming a fin structure extending from a substrate, and depositing the first, second, and third gate structures over a top and sidewalls of the fin.

18. The method of claim 16, wherein a difference between the fifth and sixth width is equal to the difference between the first and second width.

19. The method of claim 16, further comprising depositing respective hard masks on the first gate structure, the second gate structure, and the third gate structure.

20. The method of claim 16, wherein the at least one parameter of the etch process is selected from the group consisting of etching pressure, RF bias voltage, and over etching time.

* * * * *